(12) United States Patent
Singh et al.

(10) Patent No.: US 6,306,718 B1
(45) Date of Patent: Oct. 23, 2001

(54) METHOD OF MAKING POLYSILICON RESISTOR HAVING ADJUSTABLE TEMPERATURE COEFFICIENTS

(75) Inventors: Varun Singh, Dallas; Tanmay Kumar, Denton; Thomas E. Harrington, III, Carrollton; Roy Austin Hensley, Plano; Allan T. Mitchell, Heath; Jack Gang Qian, Plano, all of TX (US)

(73) Assignee: Dallas Semiconductor Corporation, Dallas, TX (US)

( * ) Notice: Subject to any disclaimer, the term of this patent is extended or adjusted under 35 U.S.C. 154(b) by 0 days.

(21) Appl. No.: 09/558,905

(22) Filed: Apr. 26, 2000

(51) Int. Cl.[7] .................................................. H01L 27/02
(52) U.S. Cl. ........................ 438/382; 438/238; 438/385
(58) Field of Search .............................. 438/238, 382–385

(56) References Cited

U.S. PATENT DOCUMENTS

| | | | |
|---|---|---|---|
| 4,210,996 | 7/1980 | Amemiya et al. | 29/610 |
| 5,187,559 | 2/1993 | Isobe et al. | 257/538 |
| 5,854,103 | * 12/1998 | Liang | 438/238 |
| 6,204,105 | * 3/2001 | Jung | 438/238 |

OTHER PUBLICATIONS

"Electrical Trimming of Heavily Doped Polycrystalline Silicon Resistors", by Yoshihito Amemiya, Terukazu Ono and Kotaro Kato, IEEE Transactions on Electron Devices, vol. ED–26, No. 11, Nov. 1979.

"A Physical Mechanism of Current–Induced Resistance Decrease in Heavily Doped Polysilicon Resistors", by Kotaro Kato, Terukazu Ono, and Yoshihito Amemiya, IEEE Transactions on Electron Devices, vol. ED–29, No. 8, Aug. 1982.

"A Monolithic 14 Bit D/A Converter Fabricated with a New Trimming Technique (DOT)", by Kotaro Kato, Terukazu Ono, and Yoshihito Amemiya, IEEE Journal of Solid–State Circuits, vol. SC–19, No. 5, Oct. 1984.

"Polysilicon Resistor Trimming for Packaged Integrated Circuits", by J.A. Babcock, D.W. Feldbaumer, and V.M. Mercier, IEEE, 1993.

"Electrical Trimming of Ion–Beam–Sputtered Polysilicon Resistors by High Current Pulses", by Soumen Das and Samir K. Lahiri, IEEE Transactions on Electron Devices, vol. 41, No. 8, Aug. 1994.

"Constant Voltage Trimming of Heavily Doped Polysilicon Resistors", by Kotaro Kato and Terukazu Ono, Jpn. J. Appl. Phys. vol 34, pp. 48–53, Jan. 1995.

"Theory and Application of Polysilicon Resistor Trimming", by D.W. Feldbaumer and J.A. Babcock, Solid–State Electronics vol. 38, No. 11, pp. 1861–1869, 1995.

"Pulse Current Trimming of Polysilicon Resistors", by David W. Feldbaumer, Jeffrey A. Babcock, Vickie M. Mercier, and Christopher K.Y. Chun, IEEE Transactions on Electron Devices, vol. 42, No. 4, Apr. 1995.

"Change in Temperature Coefficient of Resistance of Heavily Doped Polysilicon Resistors Caused by Electrical Trimming", by Kotaro Kato and Terukazu Ono, Jpn. J. Appl. Phys. vol. 35, pp. 4209–4215, Aug. 1996.

"Polycrystalline Silicon for Integrated Circuits and Displays Second Edition", by Ted Kamins, p.266, 1998.

* cited by examiner

Primary Examiner—Jey Tsai

(57) ABSTRACT

A polysilicon resistor is formed using a late implant process. Low dopant concentrations on the order of $6 \times 10^{19}$ to $3.75 \times 10^{20}$ have shown good results. with a reduced post anneal temperature. Both the first and second order temperature coefficients (TC1 and TC2) can then be adjusted. Using electrical trimming resistors can be produced with highly linear temperature characteristics. By varying the geometries of the resistors, low trimming threshold current densities and voltages can be used to produce good results.

6 Claims, 6 Drawing Sheets

FIG. 6

Pre-trim and Post-trim TC2 versus Sheet Resistance

Legend:
- P-6.25E19/cm^3 pre-trim
- P-6.25E19/cm^3 post-trim
- P-1E20/cm^3 pre-trim
- P-1E20/cm^3 post-trim
- P-1.6E20/cm^3-pretrim
- P-3.75E20/cm^3-pretrim X-axis: Sheet Resistance at 25C (ohms/sq)
Y-axis: TC2 (ppm)

Trimming Direction

METHOD OF MAKING POLYSILICON RESISTOR HAVING ADJUSTABLE TEMPERATURE COEFFICIENTS

BACKGROUND OF THE INVENTION

1. Field of the Invention

The present invention relates generally to an improved polysilicon resistor and method for making the same.

2. Description of the Related Art

Various types of polysilicon resistors have been known. However in making polysilicon resistors in the past several problems and deficiencies have been noted. Specifically a trimming of the resistance value either by lasers or by having multiple resistors and having to "blow" links have been needed to obtain high accuracy in the resistance value. Further the resistors that are formed have first and second order temperature coefficients (TC1 and TC2) in normal operation ranges that make them less than ideal.

Other attempts at other non-laser trimmed resistor such as Isobe, et al. U.S. Pat. No. 5,187,559 and Amemiya et al., U.S. Pat. No. 4,210,996 have been tried. However these also suffer from various problems as to the temperature coefficients and the methods of making them are difficult. As an example although the Amemiya et al. device allows for electrical trimming however the temperature characteristics do not lend themselves to ready usage. Further a device built along the lines Amemiya et al. can only be built using doping concentrations at higher than $1 \times 10^{20}$ atoms/cm$^3$. Consequently this device is less than desirable.

A device according to Isobe, et al. actually requires that two dopings occur for each resistor one with a positive TC1 and a second with a negative TC1 be used so that a zero TC1 resistor can be formed. This increases the complexity of formation of the device. Further both dopings are at high levels of concentrations, which create problems in the manufacturing process.

SUMMARY OF THE INVENTION

The present invention overcomes the shortcomings and deficiencies noted above by providing a new electrically trimmed polysilicon resistor that can be electrically trimmed by controlling the grain boundary resistance by the movement of the impurity doping. The second order temperature coefficient can also be altered in predictable manners. The trimming range of the resistor itself also can be adjusted over a very wide range.

By having an electrically trimmed resistor of this type various types of improved and new devices can be built that have not been possible, heretofore.

The improvement provided in the accuracy of the resistors can make termination devices such as SCSI terminators with fewer and more accurate resistors, making the SCSI terminators cheaper and/or more accurate.

Improved temperature sensors are also possible. As the temperature coefficients and the resistance of one or more resistors can be independently adjusted an improved differential temperature sensor could be built. This independent adjustment can also make an improved zero temperature coefficient resistor possible that has adjustable temperature characteristics, by using two resistors and trimming them so that they have temperature coefficients of opposite signs.

The ability to adjust first and second order temperature coefficients also allows for improved second order fits of resistors or with more linear temperature characteristics. It should be noted that TC2 as will be discussed below decreases considerably with electrical trimming at various doping concentrations (see for example FIG. 6).

Other possibilities include improved anemometers and bolometers with increased sensitivity.

Also as this "trimming" can be controlled by an electrical circuit the resistor can be used as a permanent indicator of events such as ESD event or it can act as a type of electrical fuse based upon a programmed change in a resistors characteristics.

The trimmed resistor can also be used to improved bandgap circuits, A/D and D/A converters. OP-amp offsets, digital potentiometers and delay lines can likewise be improved. Also digital thermometers, oscillators and filters can also benefit from this type of resistor.

As another example an electrically trimmed resistor could act as a multi-bit analog memory by employing multiple trimmed values of one or more of these resistors.

BRIEF DESCRIPTION OF THE DRAWINGS

Other advantages and novel features of the present invention can be understood and appreciated by reference to the following detailed description of the invention, taken in conjunction with the accompanying drawings in which:

FIGS. 3–7 are graphs showing experimental test results on various versions resistors according to this invention.

DETAILED DESCRIPTION OF THE INVENTION

Figure 1:
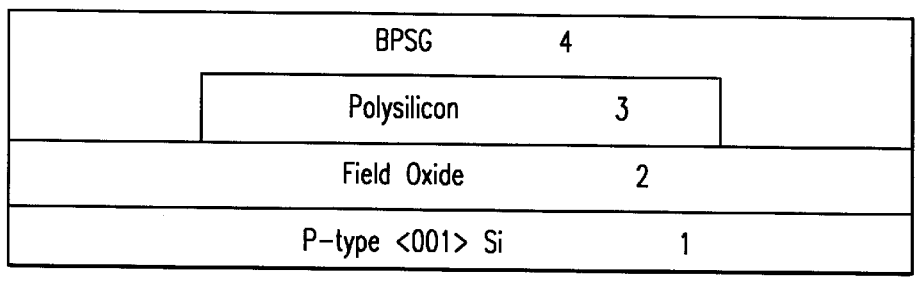
FIG. 1 is a block diagram of a resistor formed according to this invention.

Referring now to the drawings wherein like or similar elements are designated with identical reference numerals.

In the formation of the polysilicon resistor in the normal prior art process, doping is done very soon in the processing (generally immediately after) the film deposition step or in-situ during film deposition at concentrations of $\sim 1 \times 10^{20}$ cm$^{-3}$ and annealing at greater than 950° C. However the inventors herein have found that a polysilicon resistor with a much lower concentration of the dopant in the range of $6 \times 10^{19}$ cm$^{-3}$ or less can be built and can be electrically trimmed. This is thought to be possible due to a fine grain size which can result from a late implant process. This allows for a greater ability for trimming and eliminates the need for the double doping of the resistor as in Isobe, et al. Also, a lower temperature for the annealing may be used for example at a deposition temperature of 625° C. if a late implant process is employed. The low doped late-implanted resistors result in a finer grain size and hence have a higher grain boundary density compared to the highly doped early-implanted resistors. This increase in the grain boundary density results in reduced trimming current density and higher maximum trim percentages. For e.g. for a resistor of dimensions width=0.6 um, length=5 um, the late implant resistor can be trimmed to about 30% of its initial resistance while the early-implant resistor can be trimmed to only about 60% of its initial resistance.

This allows for the use of a phosphorous dopant to create a zero temperature coefficient resistor and also allowing for an electrical trimming of the thus formed resistor. Prior art devices such as are shown in Isobe et al. and Amemiya et al. have neglected changes to the second order coefficient TC2 which is significant when a lower dopant concentration is employed. In fact the prior art devices have indicated that the doping concentration must be greater than $1\times10^{20}$ atoms/$cm^3$.

The inventors have found that using a lower doping along with a lower final anneal temperature allows them to obtain an increased resistivity and the amount of dopant at the grain boundaries to also increase. This allows the resistor to be trimmed using much lower concentrations than had been thought possible.

EXAMPLE 1

The polysilicon resistors used in this example were 0.4 $\mu$m thick, phosphorus-doped and deposited at 625° C. We have used resistors with a dopant concentration in the range—$6\times10^{19}$ $cm^{-3}$ to $3.75\times10^{20}$ $cm^{-3}$ and examine the effect of electrical trimming on both TC1, TC2 and resistance. Other dopant species such as Arsenic, Boron and Antinomy, etc. are expected to produce similar results.

Figure 3:
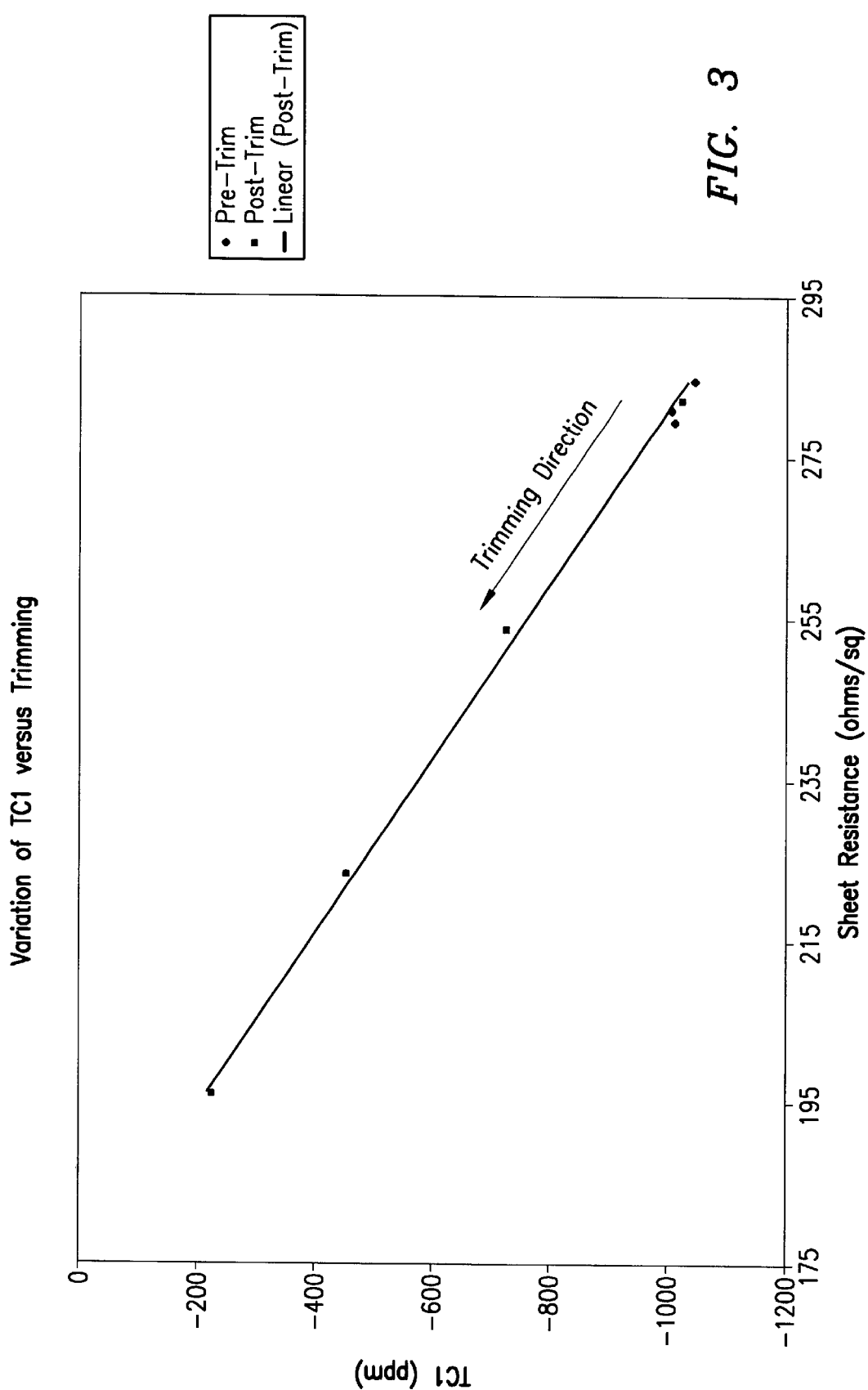

The trimming behavior of TC1 and TC2 are shown in FIGS. 3 for a phosphorus concentration $6\times10^{19}$ $cm^{-3}$ This concentration was previously classified as untrimmable by Isobe et al., U.S. Pat. No. 5,187,559. The pre-trim sheet resistances in FIG. 3 are scattered around 285 $\Omega$/square with TC1 in the 1000 ppm/° C. These data points correspond to different resistors on the same wafer and reflect the normal process variations between resistors. It can be seen that electrical trimming reduces the sheet resistance and also causes the TC1 to increase in a linear fashion. On the other hand, TC2 [FIG. 4] decreases linearly with trimming.

Figure 4:
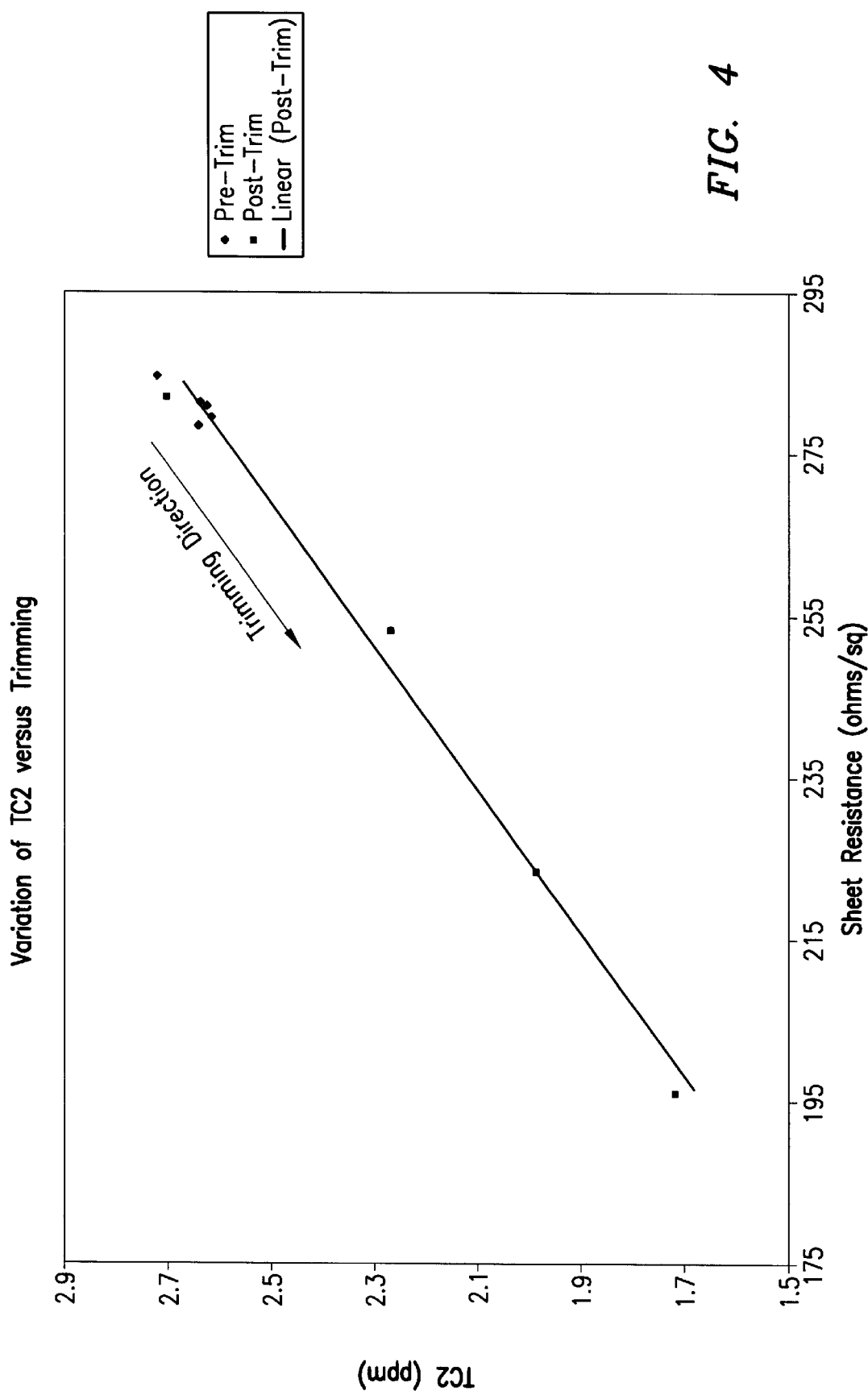
Figure 5:
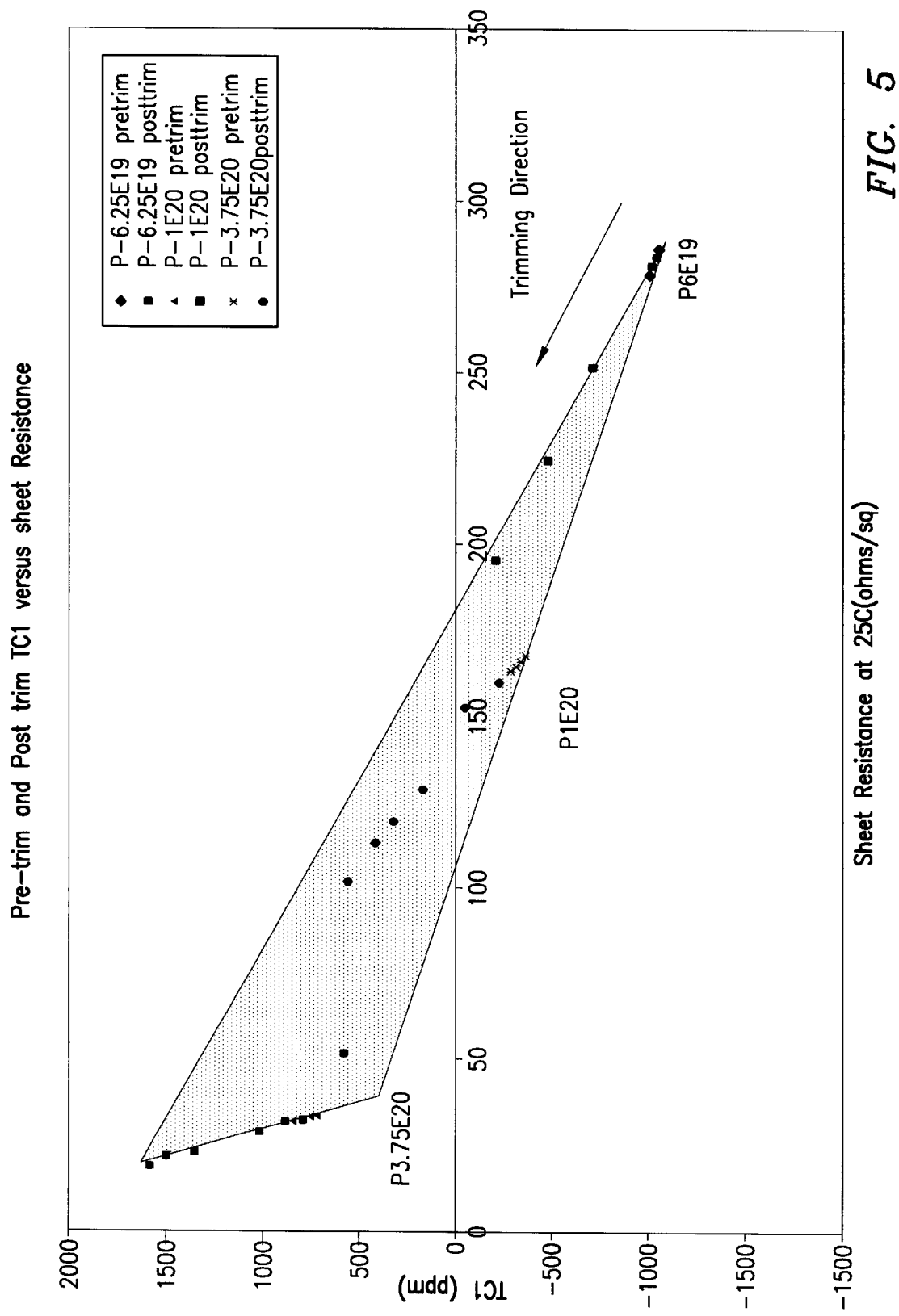

The inventors herein have used resistors ranging from a phosphorus concentration of $\sim6\times10^{19}$ $cm^{-3}$ up to $\sim3.75\times10^{20}$ $cm^{-3}$. Superimposing the data from these different dopings results in FIG. 5 and FIG. 6. From FIG. 5, it is evident that the magnitude of slope of TC1 versus Sheet Resistance curve increases as the doping is increased. Thus, by using differently doped resistors, we can obtain the same TC1 for different sheet resistances or alternately for a given Sheet Resistance we can obtain different TC1 values by changing the dopant concentration and amount of trim. The shaded area represents the possible TC1-Sheet Resistance combinations and includes the all-important zero TC1 value. It can be seen from this that the threshold current density for trimming reduces with increasing length and also has a width dependence. FIG. 4 shows the variation in TC2 versus Sheet Resistance for the dopant range mentioned above. The slope of TC2 versus sheet resistance does not change appreciably after electrically trimming the polysilicon resistors for differently doped resistors. In terms of TC2, trimming has the same effect as increasing the doping concentration during processing.

Formation of the Resistor

The formation of the resistor occurs by the following steps. In an exemplary process a substrate is initially prepared using known prior art conventional processing. A polycyrystalline silicon layer is deposited. This layer is ideally about 4000 Å thick. The layer is deposited and annealed at 625° C. with a deposition time of about 62 minutes. A poly resistor mask is then aligned and exposed. An ion implantation is done to provide the poly doping using a dose of about 1.5E16/$cm^2$ with the ion energy at 60 keV. The insulating oxidation for the poly is formed at 950° C. for about 30 minutes. The mask for implant resistor is then aligned and exposed using a dose of 2.0E15 to 1.5E16/$cm^2$ at an energy level of 100 KeV. After the resistor has been implanted an inter-level dielectric, viz. Borophosphosilicate Glass (or commonly called BPSG) is deposited on the wafer. The next step is an anneal at 900° C. for 20 minutes in order to planarize the surface and densify the BPSG. Then conventional low temperature processing is done. This low temperature processing comprises the following steps. First contacts are etched in the BPSG. Then a TiN barrier layer is deposited on the BPSG. An Al—Cu layer is then deposited. This Al—Cu layer is then patterned and etched. A TEOS deposition for is then done passivation purposes. A nitride deposition is also then done for passivation purposes. The resultant material is then patterned and etched.

Trimming of the Resistor

Figure 2:
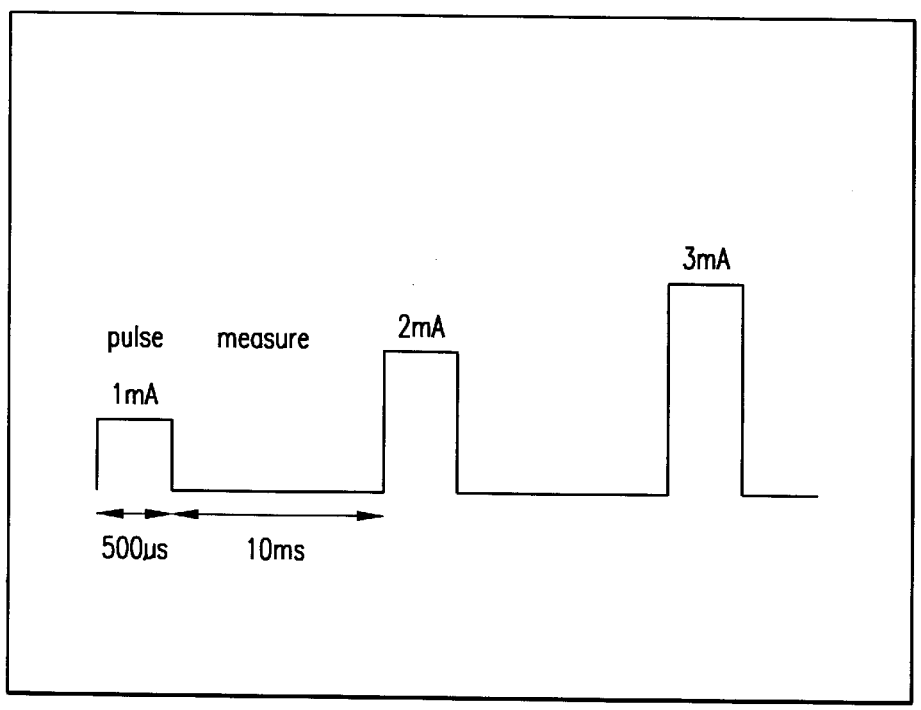
FIG. 2 is a timing diagram of a preferred embodiment for the electrical trimming or adjusting a resistor formed according to this invention.

The resistor as formed above can have the resistance and temperature coefficients adjusted by an electrical current either in the form of pulses or direct current. A typical timing diagram is given in FIG. 2 for the resistor trimming. A resistor formed according to this invention is trimmed by using current pulses of increasing amplitude while monitoring the resistance during the measure period. This is continued until the desired amount of trimming has been achieved. The pulse width that has been used successfully for this purpose is 500 us and the period is 10.5 ms.

Figure 7:
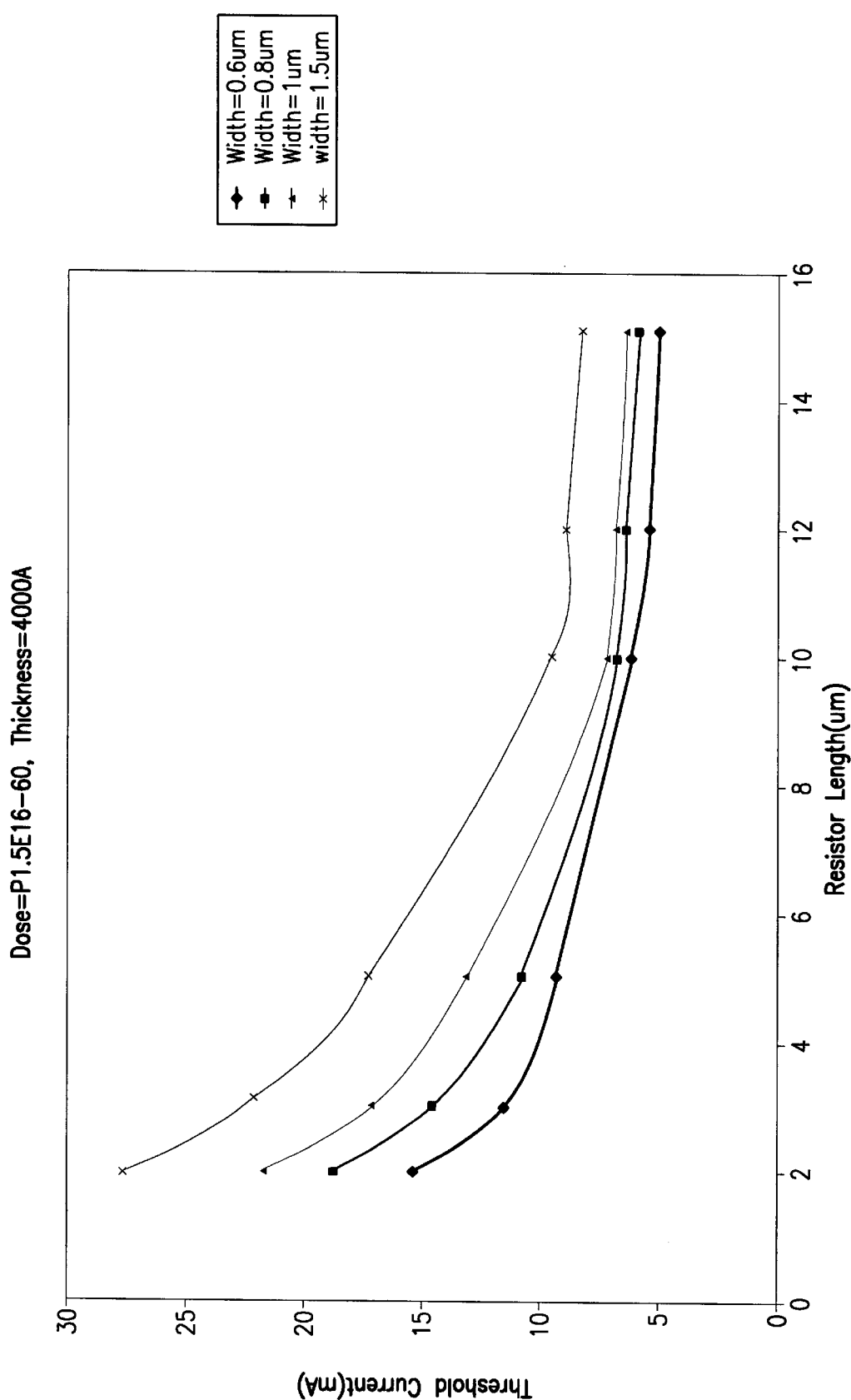

The voltages and currents used in prior art systems have generally been too high for easy incorporation into low-voltage devices. For example, the lowest threshold trimming current (the current at which the trimming begins) reported by Amemiya et al. was ~20 mA with a corresponding voltage of ~16 V. This voltage is not compatible with low-voltage processes. The inventors herein have made polysilicon resistors with widths ranging from 0.6 um to 1.5 um and lengths ranging from 2 um to 15 um (FIG. 7). It can be seen that the threshold current density for trimming reduces with increasing length and has a weak width dependence The length dependence is thought to be influenced by end effects. The dopant species from the highly doped polysilicon contact areas diffuse into the lighter doped regions, reducing the sheet resistance and increasing the grain size. Also, the polysilicon contact areas act as heat sinks reducing the average resistor temperature during trimming. This effect is pronounced for shorter resistors and decreases for longer resistors. By choosing suitable geometries resistors which trim at very low voltages and currents can be fabricated. Threshold current of ~5 mA and less have shown acceptable results. Trimming voltages as low as ~1.5 V have also produced successful results.

Further if resistors are placed over thick oxide (i.e. they have a higher degree of thermal isolation), they can be trimmed at lower currents and voltages compared to the same resistor over a thin oxide. A resistor over a thin oxide can lose heat easily to the substrate (the silicon wafer) and hence needs a higher current and voltage to reach the same temperature as a resistor over thick oxide. For example, a resistor of size width=2 um and Length=29 um had a trimming threshold at 18.5 mA, 13.3 V when placed over thick oxide (4000 A) while the same resistor with only a thin layer of oxide (150 A) separating the silicon wafer from the resistor had a trimming threshold of 34.5 mA, 21 V. This demonstrates that it is beneficial (lower trimming voltages and currents) from a trimming standpoint to thermally isolate resistors. One way to do this is to place them over a thick oxide layer so that less heat is lost by the resistor during trimming and the resistor achieves a higher temperature (The resistor heats up when you pass a current through it due to joule-heating or self-heating). An assumption which is implicit in this regard is that the resistor must heat up to a high enough temperature in order to trim.

Obviously, numerous modifications and variations are possible in view of the teachings above. For example, the temperatures, concentrations, thickness, process sequence or the like can be varied as can the specific trimming stimulus and methodology.

Accordingly, the present invention is not limited by the embodiments disclosed, but is capable of numerous rearrangements, modifications, and substitutions, without departing from the spirit and scope of the invention as set forth and defined by the following claims.

What is claimed is:

1. A method of making a polysilicon resistor comprising the steps of:

providing a substrate, depositing a polycrystalline layer on said substrate, aligning and exposing a poly protect mask, poly doping the polycrystalline layer, other than the resistor forming an insulating oxide, aligning and exposing the mask for the resistor, implanting the resistor depositing an inter level dielectric, annealing the inter level dielectric, and completing the processing using low temperature processing.

2. A method as in claim 1 wherein said first annealing step occurs at or below 900° C.

3. A method as in claim 1 wherein said formation of said insulating oxide occurs at or below 950° C.

4. A method as in claim 1 wherein said ion implantation to provide the poly doping results in a concentration of $\sim 6 \times 10^{19}$ cm$^{-3}$ to $\sim 3.75 \times 10^{20}$ cm$^{-3}$.

5. A method as in claim 1 wherein said final annealing step occurs at or below 900° C.

6. A method as in claim 1 further comprising the step of forming a field oxide layer prior to the depositing of said polycrystaline layer.

* * * * *